(12) United States Patent
Fricke et al.

(10) Patent No.: US 6,737,686 B2
(45) Date of Patent: May 18, 2004

(54) NON-VOLATILE PROGRAMMABLE MEMORY DEVICE

(75) Inventors: Peter Fricke, Corvallis, OR (US); Andrew VanBrocklin, Corvallis, OR (US); Warren B. Jackson, San Francisco, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/172,304

(22) Filed: Jun. 13, 2002

(65) Prior Publication Data

US 2003/0230770 A1 Dec. 18, 2003

(51) Int. Cl.⁷ ............................................... H01L 27/10
(52) U.S. Cl. ........................ 257/209; 257/529; 257/530
(58) Field of Search ................................. 257/209, 529, 257/530, 502, 259, 295

(56) References Cited

U.S. PATENT DOCUMENTS

| | | | | |
|---|---|---|---|---|
| 4,420,820 A | * | 12/1983 | Preedy | 365/105 |
| 4,814,853 A | * | 3/1989 | Uchida | 257/530 |
| 5,298,784 A | * | 3/1994 | Gambino et al. | 257/529 |
| 5,962,910 A | * | 10/1999 | Hawley et al. | 257/530 |
| 6,496,416 B1 | * | 12/2002 | Look | 365/185.18 |

* cited by examiner

Primary Examiner—David Nelms
Assistant Examiner—Tu-Tu Ho

(57) ABSTRACT

A memory cell includes a heating component that is connected to a voltage-breakdown component. The heating component is configured to accelerate the break-down of a voltage-breakdown component. Memory structures and methods for making them are also disclosed.

12 Claims, 6 Drawing Sheets

NON-VOLATILE PROGRAMMABLE MEMORY DEVICE

FIELD OF THE INVENTION

This invention relates to memory devices and, in particular, to non-volatile programmable memory devices.

DESCRIPTION OF THE RELATED ART

There is an increasing demand for cost-effective resistance-based memory modules which offer the advantage of reduced size and improved storage capacity. A resistance based memory module may be, for example, a field programmable gate array (FPGA) or a programmable read-only memory (PROM), among others. Each memory cell in a resistance-based memory module comprises a resistive memory component, such as, for example, a fuse or an anti-fuse. The resistance value of any one memory cell can be configured to be relatively high (e.g., 10 Meg ohms), which translates to a logical bit value of one, or relatively low (e.g., 100 Kilo ohms), which translates to a logical bit value of zero. The resistance of a selected memory cell can be determined by applying a voltage to the memory cell and measuring the current that flows through it.

Configuring the resistance of a memory cell (i.e., programming it) typically involves creating a voltage differential across the memory cell, thereby causing a write current to pass through it. The write current is typically significantly greater than a read current that is used for reading the memory cell. Furthermore, the write current is required to flow through the memory cell for at least a predetermined time period in order for the memory cell to be programmed. As a result, programming a large number of memory structures, wherein each memory structure comprises a large number of memory cells, may require a long time, may consume a lot of power, and may be costly. As a hypothetical example, if a memory cell requires 2 milliWatts for a period of 100 microseconds to be programmed and if each memory structure contains one million memory cells that are to be programmed, then in order to program one thousand such memory structures, more than a day and 200 Joules may be needed. Although the time to program a large number of memory structures may be reduced by using a greater number of programming devices, such an approach may be very costly. As a result there exists a need for systems and methods that address these and/or other problems associated with prior art resistance-based memory structures.

SUMMARY

The present invention provides systems and methods for storing data. In one embodiment of the invention, a memory cell includes a heating component that is connected to a voltage-breakdown component. In another embodiment, a memory cell includes an exothermic voltage-breakdown component. In yet another embodiment, a memory device includes memory cells located between a first plurality of conductors and a second plurality of conductors, wherein each memory cell includes a heating component and a voltage-breakdown component.

BRIEF DESCRIPTION OF THE DRAWINGS

The invention can be better understood with reference to the following drawings. The components in the drawings are not necessarily to scale, emphasis instead being placed upon clearly illustrating the principles of the invention. Moreover, in the drawings, like reference numerals designate corresponding parts throughout the several views.

DETAILED DESCRIPTION

Systems and methods of the invention allow for lower power consumption and/or faster programming of a non-volatile memory structure. In one embodiment of the invention, this is accomplished by including a heating component and/or an exothermic voltage-breakdown component (VBC) in each memory cell. The VBC may be, for example, a fuse or an anti-fuse and may include one or more materials that provide a net release of energy as a result of a chemical reaction. The heating component can accelerate the "break-down" of the VBC. If the VBC is a fuse, then the VBC is said to be broken-down if a conductive path within the VBC has been substantially disintegrated or diminished during the programming of the corresponding memory cell. Conversely, if the VBC is an anti-fuse, then the VBC is said to be broken-down if a conductive path within the VBC has been created or substantially enhanced during the programming of the corresponding memory cell. The preferred embodiments of the present invention now will be described more fully hereinafter with reference to the accompanying drawings. These embodiments are examples, among others, of systems and methods of the present invention. Therefore, the present invention, which may be embodied in many different forms, should not be construed as limited to the embodiments set forth herein.

Figure 1:
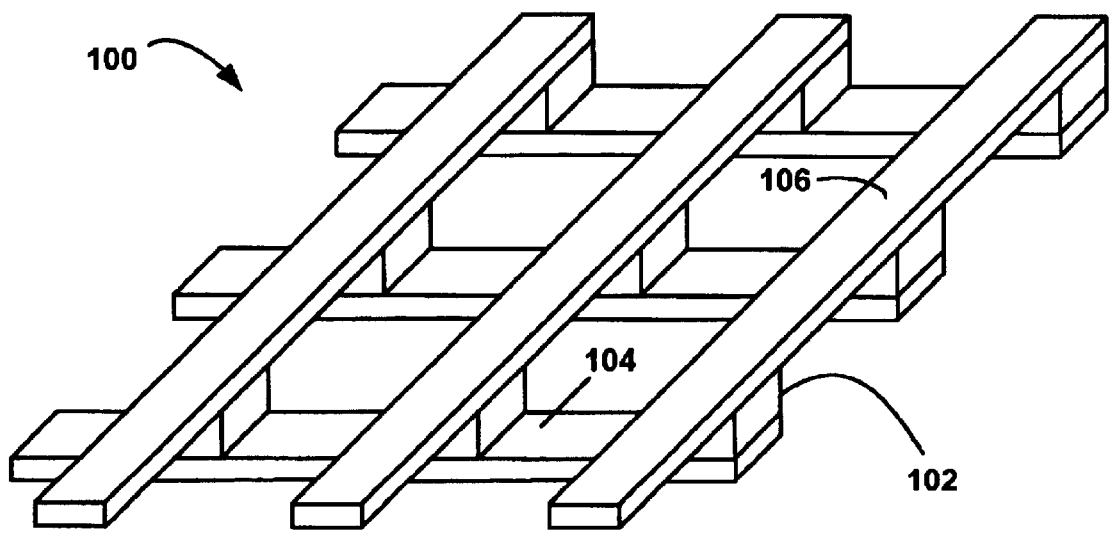
FIG. 1 is a schematic diagram of one embodiment of a memory array.

FIG. 1 is a schematic diagram of one embodiment of a memory array 100. The memory array 100 has conductive traces that are formed as rows 104 of conductive material crossing over columns 106 of conductive material. Note that in an alternative embodiment, the rows 104 and the columns 106 may be non-orthogonal. Each memory cell 102 is connected between a row 104 and a column 106 and includes a VBC. Each memory cell 102 has a determinable resistance value when a potential is applied across it. The resistance value of any one memory cell 102 at any cross-point can be designed to be relatively high or relatively low. If the VBC is a fuse, then the resistance of the memory cell 102 is increased by breaking-down the fuse. However, if the VBC is an anti-fuse, then the resistance of the memory cell 102 is decreased by breaking-down the VBC. A relatively high resistance may be interpreted as a logical bit value of one, and a relatively low resistance may be interpreted as a logical bit value of zero, or vice versa, depending on a desired implementation.

For illustration purposes, FIG. 1 shows only one layer of a memory array 100 and only a few memory cells 102. Those reasonably skilled in the art will appreciate that a memory array can be fabricated with any number of layers, and with any number of memory cells 102 per layer to accommodate a desired memory capacity. Furthermore, the memory array 100 may comprise inter-layer dielectric material (not shown) that is located between memory cells 102, between rows 104, and/or between columns 106.

It is contemplated that an embodiment of a memory array 100 may be fabricated using integrated circuit (IC) fabrication technology. This fabrication technology can be directed to certain classes of IC chips such as field programmable gate arrays (FPGAs), programmable read-only memories (PROMS) and the like. FPGAs typically include a large number of logic components, such as AND gates and OR gates, which can be selectively coupled to perform desired functions.

Figure 2A:
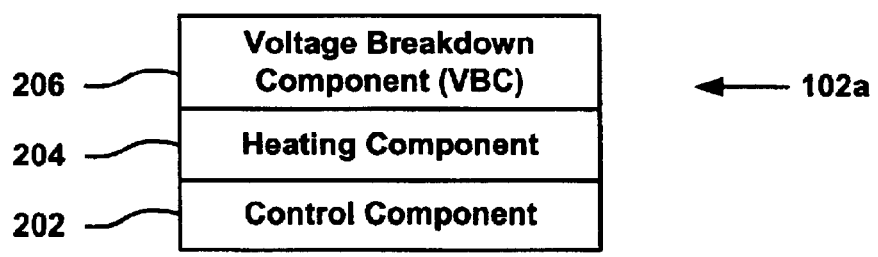
FIGS. 2A–2E are schematic diagrams depicting example embodiments of memory cells that can be used in the memory array shown in FIG. 1.

FIGS. 2A–2E are schematic diagrams depicting example embodiments of memory cells that can be used in the memory array 100 (FIG. 1). As shown in FIG. 2A, the memory cell 102a includes a heating component 204 and a VBC 206 that are in contact with each other. The heating component 204 may comprise a material that provides high thermal resistance such as, for example, titanium, tungsten, or an alloy thereof. Note that in an alternative implementation, the heating component 204 may be located above the VBC 206.

A control component 202 is connected in series with the heating component 204 and the VBC 206. The control component 202 helps to electrically isolate a memory cell 102a from other memory cells in the memory array 100 (FIG. 1) and thereby reduces the flow of parasitic currents through the memory cell 102a. The control component may be, for example, a diode or a tunnel junction.

When a memory cell 102a is to be programmed with a desired logical bit value, a voltage is applied across the memory cell 102 causing a current to pass through it. This current causes an increase in the temperature of the heating component 204. If the VBC 206 is a fuse, then this increase in temperature accelerates the disintegration of a conductive pathway provided by the VBC 206. When a conductive pathway disintegrates, the resistance of the memory cell 102a increases to a level that represents a desired logical bit value. The disintegration of a conductive pathway provided by the VBC 206 may be caused by a chemical reaction, thermal breakdown, and/or electro-migration. If the VBC 206 is an anti-fuse, then the increase in temperature may accelerate the formation of a conductive pathway in the VBC 206.

Electro-migration is the physical movement of material caused by current flow. This movement may cause material to be depleted from one part of the VBC 206 and to accumulate at another location. At the depletion site, the cross-sectional area of the conductive pathway is reduced. This increases the current density which increases the electro-migration effect even more and may lead to "burn-out" at the thinnest portion of the conductive pathway.

One or more materials comprised within the VBC 206 may undergo an exothermic chemical reaction. An advantage of an exothermic chemical reaction is that it may cause a fuse or an anti-fuse to be broken-down more rapidly while requiring less energy to be supplied by an external circuit. An exothermic chemical reaction may involve, for example, oxidation. In one implementation, the VBC 206 may comprise one or more of the following exothermic materials, among others: PETN (pentaerythritol tetranitrate), aluminum-palladium, atomized aluminum powder, and/or thermite. The exothermic material may be selected so as to minimize the damage to neighboring structures during an exothermic reaction. For instance, the desirability of a particular exothermic material for use in the VBC 206 may depend on factors such as the size of the memory cells 102a, the number of layers of memory cells 102, the distance between memory cells 102a, and the nature of other materials used in forming the memory cells 102a.

Figure 2B:
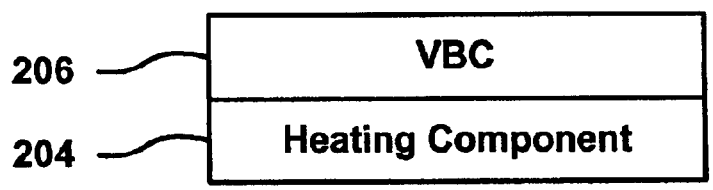

In the embodiment shown in FIG. 2B, a memory cell 102b does not include a control component 202 (FIG. 2A). The control component 202 may be omitted if, for example, improved electrical isolation of the memory cell 102b is not necessary or may be achieved by some other means.

Figure 2C:
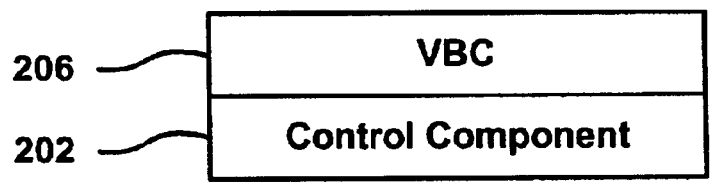

In another embodiment, as shown in FIG. 2C, a memory cell 102c does not include a heating component 204 (FIG. 2A). The heating component 204 may be omitted if, for example, the VBC 206 may be easily broken-down without the use of the heating component 204. For instance, the VBC 206 may comprise one or more materials that undergo an exothermic chemical reaction when a certain voltage is applied across the VBC 206.

Figure 2D:
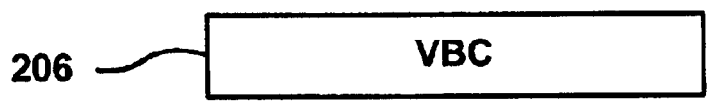

In the embodiment shown in FIG. 2D, a memory cell 102d does not include a heating component 204 or a control component 202 (FIG. 2A). The heating component 204 and the control component 202 may be omitted for reasons specified above and/or for other reasons.

Figure 2E:
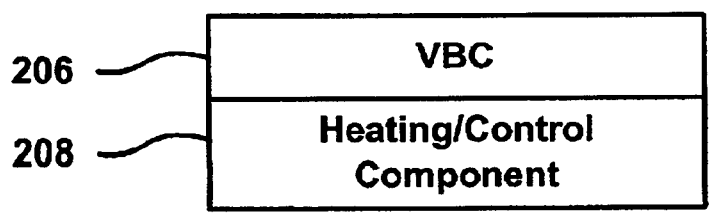

In yet another embodiment, as shown in FIG. 2E, a memory cell 102e includes a heating/control component 208 that provides the functionality of both a control component 202 and a heating component 204 (FIG. 2A). The heating/control component 208 may comprise, for example, a tunnel junction having two electrodes and a tunneling barrier therebetween.

Note that in an alternative embodiment, the relative positions of two or more memory cell components may be different than shown in FIGS. 2A–2C. For instance, in one embodiment, a heating component 204 may be located above a VBC 206. Furthermore, a memory cell 102 (FIGS. 2A–2D) may optionally comprise top and bottom electrodes (not shown). The top electrode may be in contact with the VBC 206 whereas the bottom electrode may be in contact with the control component 202 (FIGS. 2A and 2C), the heating component (FIG. 2B), or the VBC 206 (FIG. 2D).

Figure 3A:
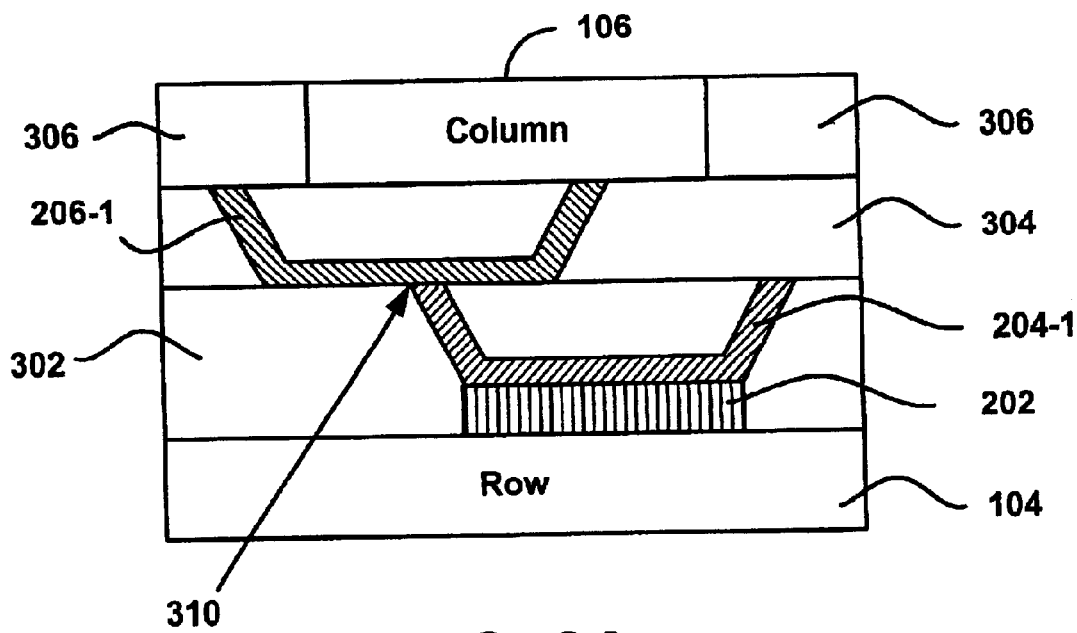
FIG. 3A is a cross-sectional view of a cross-point of a memory array illustrating one embodiment of the memory cell shown in FIG. 2.

FIG. 3A is a schematic diagram depicting a cross-sectional view of a portion of a memory array 100 (FIG. 1) illustrating one embodiment of the memory cell 102 (FIG. 2). The memory cell 102 includes a heating component 204-1 and a fuse 206-1 that contact each other at a contact point 310. The heating component 204-1, fuse 206-1, the row 104, and the column 106 are each formed within an interlayer dielectric layer (ILD). As shown in FIG. 3A, the heating component 204-1 is formed within ILD 302, the fuse 206-1 is formed within ILD 304, and the column 106 is formed within ILD 306. Although the row 104 is also formed within an ILD, such ILD is not visible in the cross-sectional view of FIG. 3A. The heating component 204-1 and the fuse 206-1 each has a tub-like shape. If the fuse 206-1 comprises metal, then it preferably has a thickness between 1 and 5 nanometers (nm). However, if the fuse 206-1 comprises a semiconductor, then it preferably has a thickness between 5 and 50 nm. When a current passes through the memory cell 102, it causes an increase in the temperature of the heating component 204-1. As a result, the heating component 204-1 heats a portion of the fuse 206-1 near the contact point 310 and thereby increases the rate of disintegration of that portion of the fuse 206-1. In one embodiment, this disintegration is caused by electromigration.

Figure 3B:
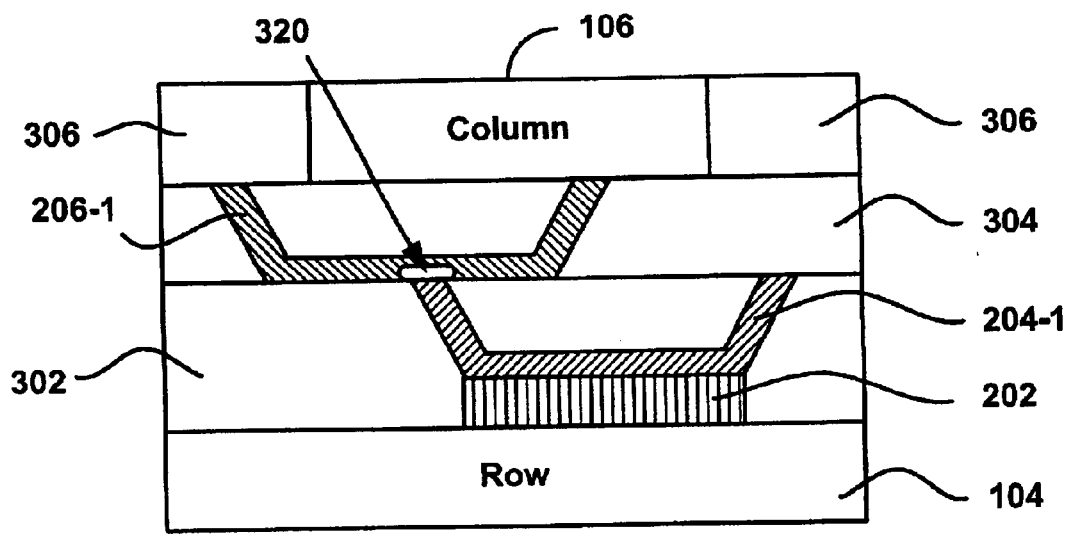
FIG. 3B depicts the memory cell shown in FIG. 3A after it has been programmed.

FIG. 3B is a schematic diagram depicting the effect of a programming voltage on the memory cell 102 shown in FIG. 3A. As shown in FIG. 3B, a depleted region 320 is formed within the fuse 206-1 near the former contact point 310 (FIG. 3A). As a result, a conductive pathway between the row 104 and the column 106 is broken and the memory cell 102 is programmed with a desired logical bit value corresponding to a high resistance.

Figure 4A:
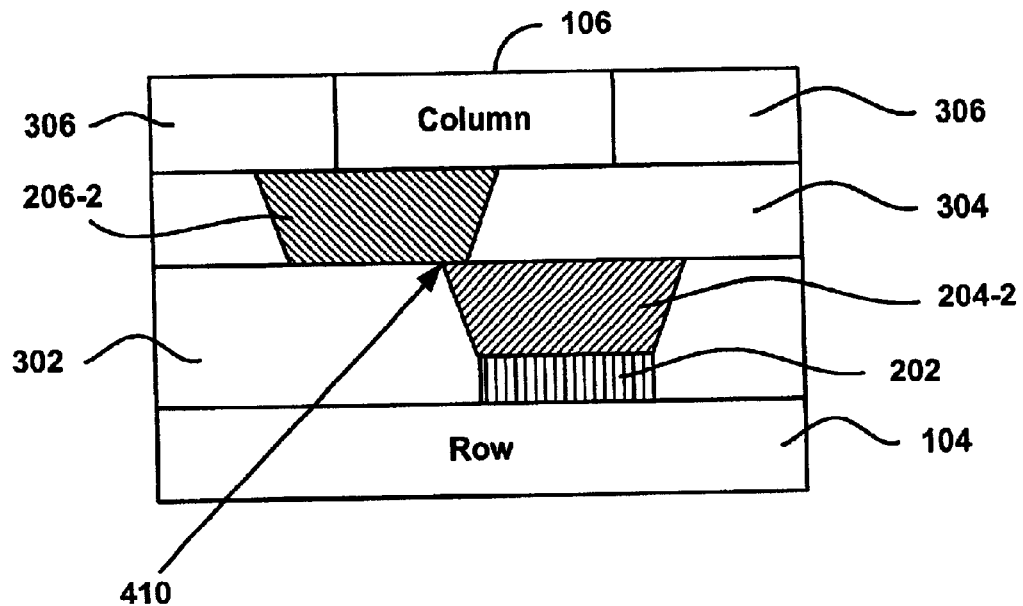
FIG. 4A is a cross-sectional view of a cross-point of a memory array illustrating another embodiment of the memory cell shown in FIG. 2.

FIG. 4A is a schematic diagram depicting a cross-sectional view of a portion of a memory array 100 (FIG. 1) illustrating another embodiment of the memory cell 102 (FIG. 2). The memory cell 102 includes a heating component 204-2 and a fuse 206-2 that contact each other at a contact point 410. The heating component 204-2 and the fuse 206-2 each has a plug-like shape. When a current passes through the memory cell 102, it causes an increase in the temperature of the heating component 204-2. As a result, the heating component 204-2 heats up a portion of the fuse 206-2 near the contact point 410 and thereby increases the rate of disintegration of that portion of the fuse 206-2.

Figure 4B:
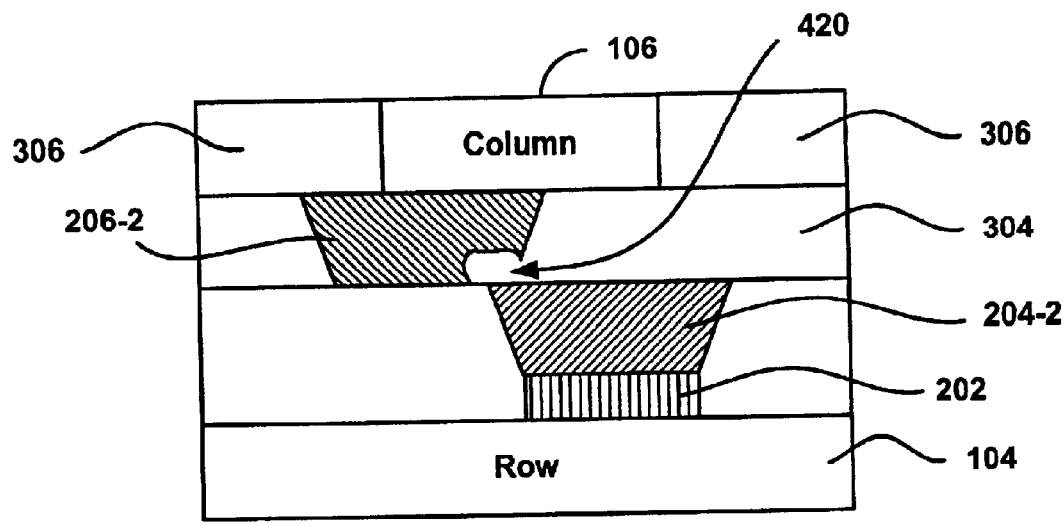
FIG. 4B depicts the memory cell shown in FIG. 4A after it has been programmed.

FIG. 4B is a schematic diagram depicting the effect of a programming voltage on the memory cell 102 shown in FIG. 4A. As shown in FIG. 4B, a depleted region 420 is formed within the fuse 206-2 near the former contact point 410 (FIG. 4A). As a result, a conductive pathway between the row 104 and the column 106 is broken and the memory cell 102 is programmed with a desired logical bit value corresponding to a high resistance.

In another embodiment, the heating component 204-1 (FIG. 3A) may be used in conjunction with the fuse 206-2. In yet another embodiment, the heating component 204-2 may be used in conjunction with the fuse 206-1 (FIG. 3A). Those reasonably skilled in the art will understand that other configurations of a heating component 204 and a VBC 206 (FIG. 2) may be used in other embodiments.

Figure 5:
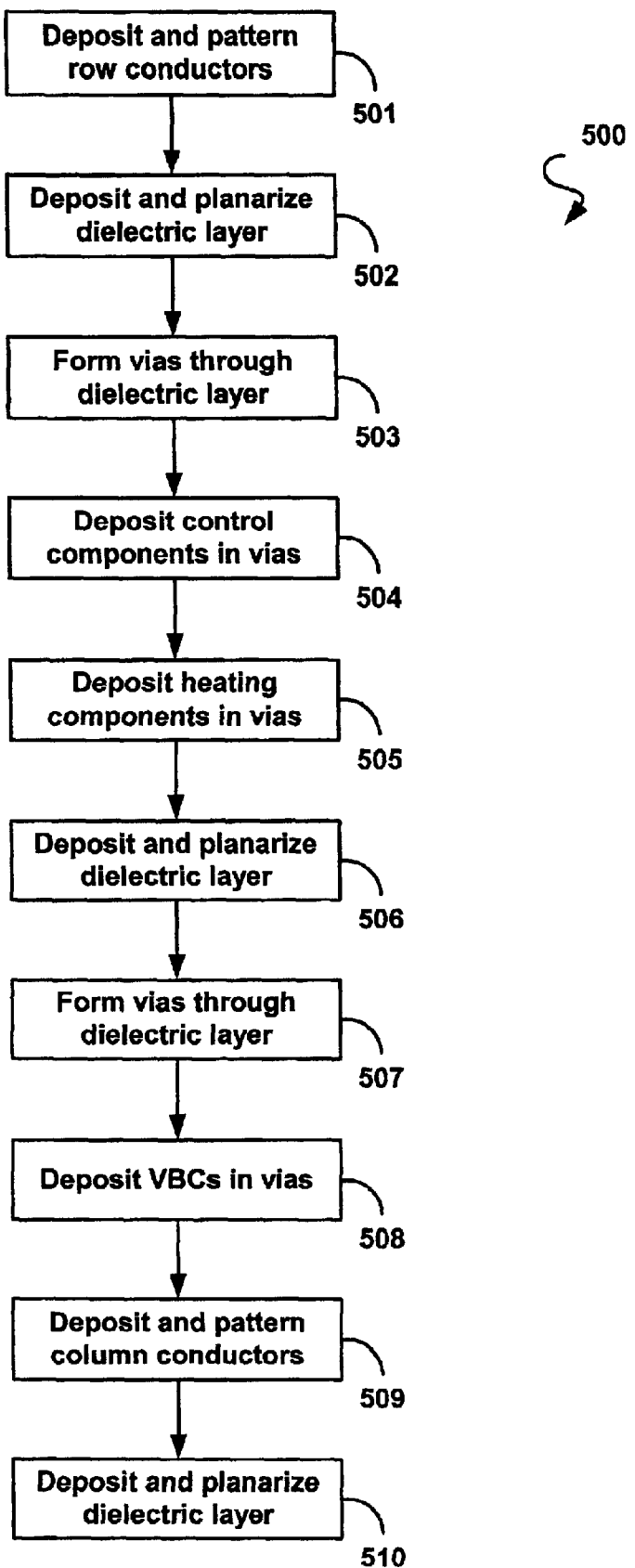
FIG. 5 is a flow chart depicting an example method for forming one embodiment of the memory array depicted in FIG. 1.

FIG. 5 is a flow chart depicting an example method 500 for forming one embodiment of a memory array 100 (FIG. 1). The memory array 100 is preferably fabricated upon a substrate. The substrate may be made of any suitable material such as, for example, silicon, glass, gallium arsenide, silicon on sapphire (SOS), epitaxial formations, germanium, germanium silicon, diamond, silicon on insulator (SOI) material, selective implantation of oxygen (SIMOX) substrates, among others.

In step 501, conductive material is deposited on a substrate and patterned into rows. The conductive material may be comprise, for example, among others, polysilicon, titanium nitride (TiN), titanium (Ti), aluminum (Al), aluminum alloy, tantalum nitride (TaN), copper (Cu), and/or tantalum. The conductive material may be patterned using, for example, photoresist or laser etching. After the conductive material is deposited and patterned, a first dielectric layer is deposited and planarized in step 502. The dielectric layer may comprise, for example, but not limited to, doped or non-doped silicon dioxide (SiO$_2$), silicon nitride, tetraethylorthosilicate (SiOC$_2$H$_5$)$_4$) (TEOS) based oxides, borophosphosilicate glass (BPSG), phosphosilicate glass (PSG), borosilicate glass (BSG), polyamide film, oxynitride, a spin on glass (SOG), any chemical vapor deposited (CVD) dielectric including a deposited oxide, a grown oxide, and/or like dielectric materials. After being deposited, the dielectric layer may be planarized using, for example, a chemical mechanical polishing (CMP) process or an etch-back process. The planarized dielectric layer fills the gaps between the rows and also extends above the rows.

After the first dielectric layer is planarized, vias are formed through it in step 503. Then, a control component and a heating component are deposited in each via in steps 504 and 505, respectively. A control component may be, for example, a diode or a tunnel junction. A heating component may comprise a material that provides high thermal resistance such as, for example, titanium, tungsten, or an alloy thereof.

In an alternative embodiment a heating/control component is deposited in lieu of steps 504 and 505. The heating/control component may provide the functionality of both a control component and a heating component. The heating/control component may comprise, for example, a tunnel junction having two electrodes and a tunneling barrier therebetween.

After the heating components are deposited in the vias, a second dielectric layer is deposited and planarized in step 506. The planarized second dielectric layer fills any gaps that may remain in the vias and extends above the top level of the first dielectric layer.

After the second dielectric layer is planarized, vias are formed through it in step 507 and VBCs are deposited within respective vias in step 508. Each VBC is deposited such that it is located above and is in contact with a corresponding heat component. In step 509, conductive material is deposited on the second dielectric layer and is patterned into column. Each column is configured to be located above and to be in contact with a corresponding subset of VBCs. Finally, in step 510, a third dielectric layer is deposited and planarized. The planarized third dielectric layer fills gaps between the column.

Figure 6A:
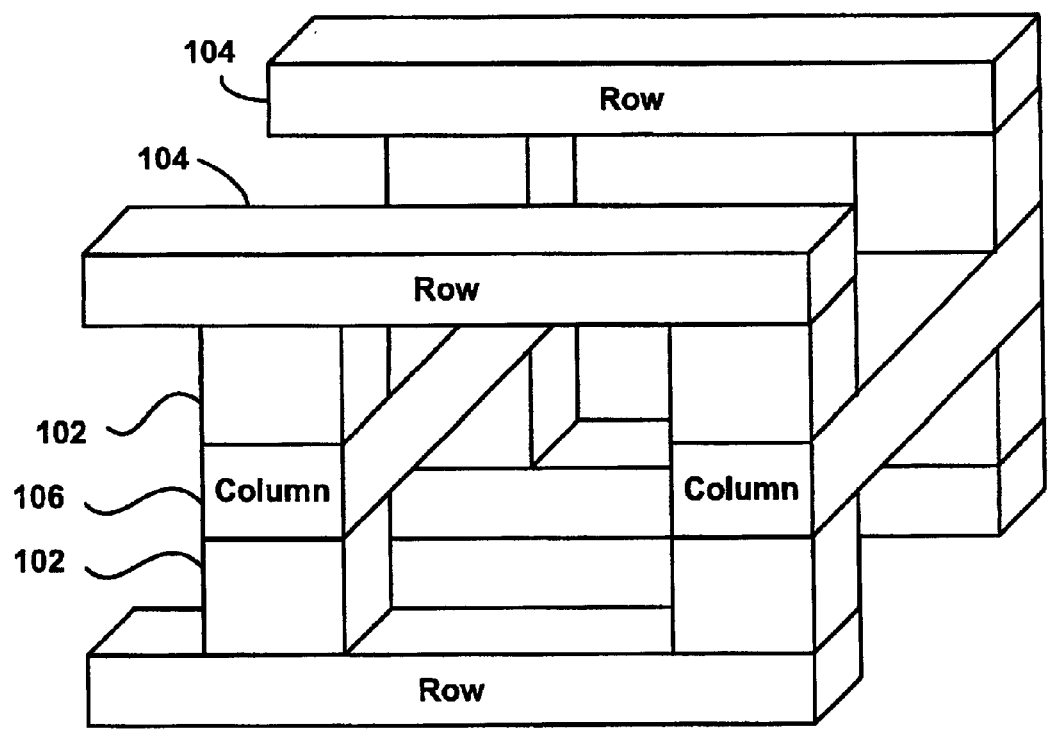
FIGS. 6A and 6B are schematic diagrams depicting a perspective view and a side view, respectively, of a memory array that represents an alternative embodiment to the memory array depicted in FIG. 1.
Figure 6B:
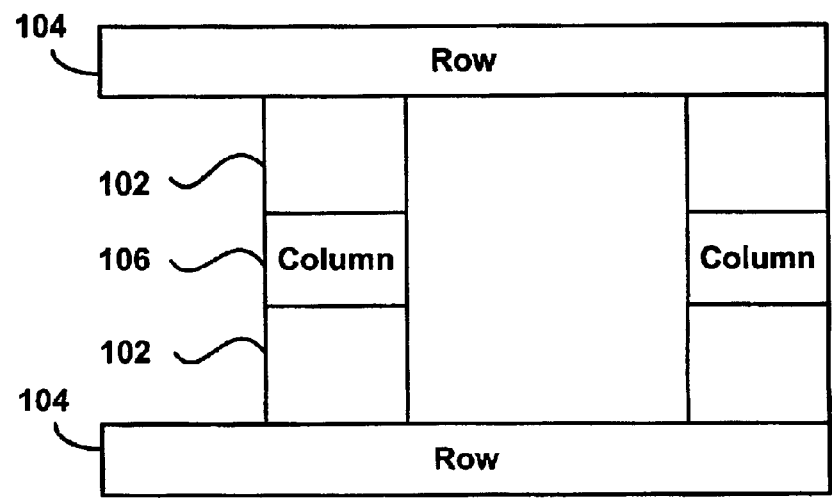

FIGS. 6A and 6B are schematic diagrams depicting a perspective view and a side view, respectively, of a memory array 600 that represents an alternative embodiment to the memory array 100 (FIG. 1). For illustration purposes, FIGS. 6A and 6B only show a few memory cells 102. Those reasonably skilled in the art will appreciate that a memory array can be fabricated with any desired number of memory cells 102. The memory array 600 has conductive traces that are formed as columns 106 of conductive material crossing between two sets of rows 104 of conductive material. The memory array 600 comprises twice as many rows 104 as columns 106. Each column 106 is connected to a first plurality of memory cells 102 located above the column 106 and to a second plurality of memory cells 102 located below the column 106. Furthermore, each memory cell is connected to a row 104. One advantage of the memory array 600 is that it can contain a higher density of memory cells 102 than that of the memory array 100.

It should be emphasized that the above-described embodiments of the invention are merely possible examples, among others, of the implementations, setting forth a clear understanding of the principles of the invention. Many variations and modifications may be made to the above-described embodiments of the invention without departing substantially from the principles of the invention. All such modifications and variations are intended to be included herein within the scope of the disclosure and invention and protected by the following claims.

What is claimed is:

1. A memory device comprising:

an electrically conductive column;

an electrically conductive row spaced from and overlying the electrically conductive column; and a memory cell electrically connecting the electrically conductive column and the electrically conductive row, the memory cell being operative to store information based upon a resistance exhibited by the memory cell, the memory cell comprising an electrically conductive path, the electrically conductive path comprising an exothermic material, the exothermic material being responsive to heat such that, in response to the heat, the exothermic material undergoes an exothermic chemical reaction that alters the resistance of the memory cell to change the information stored by the memory cell.

2. The memory device of claim 1, further comprising:

a heater directly contacting the electrically conductive path, the heater being operative to receive an applied voltage and, in response thereto, apply the heat to the conductive path such that the exothermic material undergoes the exothermic chemical reaction that alters the resistance of the memory cell to change the information stored by the memory cell.

3. The memory device of claim 2, wherein:

the heat corresponds to resistive heating of the electronically conductive path in response to an applied voltage; and the exothermic material is operative to undergo the exothermic chemical reaction due to the resistive heating.

4. The memory device of claim 2, further comprising:

a control component electrically connected in series with the heater, the control component being operative to reduce a flow of parasitic current through the memory cell.

5. The memory device of claim 2, wherein the electrically conductive path of the memory cell comprises a fuse.

6. The memory device of claim 5, wherein the exothermic material is entaerythritol tetranitrate (PETN).

7. The memory device of claim 5, wherein the exothermic material is aluminum-palladium.

8. The memory device of claim 5, wherein the exothermic material is aluminum powder.

9. The memory device of claim 5, wherein the exothermic material is thermite.

10. The memory device of claim 1, wherein the electrically conductive path of the memory cell comprises an anti-fuse.

11. The memory device of claim 1, wherein the exothermic material is operative to oxidize in response to the heat.

12. The memory device of claim 11, wherein the exothermic material is operative to combust in response to the heat.

* * * * *